(12) United States Patent
Krivokapic

(10) Patent No.: US 11,894,814 B2
(45) Date of Patent: Feb. 6, 2024

(54) EXTENDED SPECTRUM TDMA UPSTREAM AND DOWNSTREAM CABLE AMPLIFIER

(71) Applicant: Pulselink, Inc, Carlsbad, CA (US)

(72) Inventor: Ivan Krivokapic, San Diego, CA (US)

(73) Assignee: PULSELINK, INC

( * ) Notice: Subject to any disclaimer, the term of this patent is extended or adjusted under 35 U.S.C. 154(b) by 0 days.

(21) Appl. No.: 16/983,754

(22) Filed: Aug. 3, 2020

(65) Prior Publication Data
US 2021/0036666 A1 Feb. 4, 2021

Related U.S. Application Data

(60) Provisional application No. 62/882,005, filed on Aug. 2, 2019.

(51) Int. Cl.
*H03F 3/189* (2006.01)
*H04B 3/52* (2006.01)

(52) U.S. Cl.
CPC ....... *H03F 3/189* (2013.01); *H03F 2200/451* (2013.01); *H04B 3/52* (2013.01)

(58) Field of Classification Search
CPC .......... H03F 2200/63; H03F 3/62; H03F 3/72; H04J 3/1694; H04B 3/50; H04B 3/52
See application file for complete search history.

(56) References Cited

U.S. PATENT DOCUMENTS

| | | | | |
|---|---|---|---|---|
| 6,928,528 | B1* | 8/2005 | Hewitt | H04L 7/02 710/52 |
| 2007/0291668 | A1* | 12/2007 | Duan | H04W 56/001 370/280 |
| 2020/0274577 | A1* | 8/2020 | Jin | H04B 3/08 |

* cited by examiner

*Primary Examiner* — David S Huang
(74) *Attorney, Agent, or Firm* — The Belles Group, P.C.

(57) ABSTRACT

A method of bidirectional amplification of proprietary TDMA (Time-Division Multiple Access) data modulated signals over CATV infrastructure is described. A method of upstream/downstream switching based on carrier detection/measurement originated from the master and slave modems embodiment is described, along with upstream/downstream direction switching based on the encoded switching command detection, originating from the master modem.

8 Claims, 2 Drawing Sheets

FIGURE 1

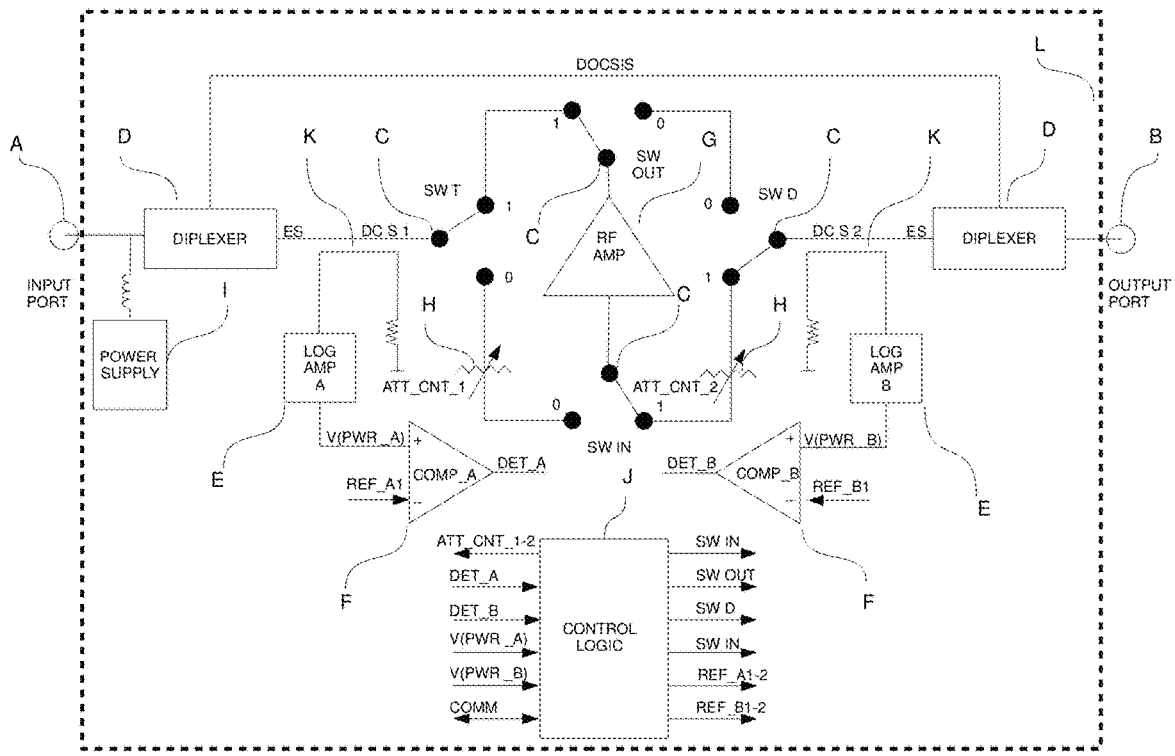

FIGURE 2

| FUNCTIONAL MODES | SW T | SW D | SW IN | SW OUT | DET A | DET B | COMMENT |
|---|---|---|---|---|---|---|---|
| Default Mode | 0 | 0 | 1 | 1 | 0 | 0 | Neutral |
| MASTER ->SLAVE Start -Transition | 0 | 0 | 1 | 1 | 1 | 0 | Switch to operation mode on DET A rising edge |
| MASTER ->SLAVE Start - Operation | 0 | 0 | 0 | 0 | 1 | X | |
| MASTER ->SLAVE Stop- Operation | 0 | 0 | 0 | 0 | 0 | X | |
| MASTER ->SLAVE Stop-Transition | 0 | 0 | 1 | 1 | 0 | X | Switch to neutral mode on DET A falling edge |
| Default Mode | 0 | 0 | 1 | 1 | 0 | 0 | Neutral |
| SLAVE -> MASTER Start Transition | 0 | 0 | 1 | 1 | 0 | 1 | Switches to operation mode on DET B rising edge |
| SLAVE -> MASTER Start - Operation | 1 | 1 | 1 | 1 | X | 1 | |
| SLAVE -> MASTER Stop- Operation | 1 | 1 | 1 | 1 | X | 0 | |
| Default Mode | 0 | 0 | 1 | 1 | 0 | 0 | Switch to neutral mode on DET B falling edge |

EXTENDED SPECTRUM TDMA UPSTREAM AND DOWNSTREAM CABLE AMPLIFIER

CROSS REFERENCE TO RELATED APPLICATIONS

The present application claims the benefit of U.S. Provisional Patent Application No. 62/882,005 filed on Aug. 2, 2019, which is incorporated herein by reference.

BACKGROUND

Prior art considers DOCSIS/CATV (Cable TV) cable amplifiers operating in continuous, full duplex cable systems, in unidirectional or bidirectional fashion, thus supporting standard CATV or data signal amplification in distribution cable or drop cable domains.

BRIEF SUMMARY

This invention relates to the field of proprietary TDMA (Time-Division Multiple Access) data modulated signals bidirectional amplification system that works over CATV infrastructure. Target operation bandwidth lies in extended spectrum that is usually allocated above the frequency band defined in DOCSIS standards.

A method of bidirectional amplification of proprietary TDMA data modulated signals over CATV infrastructure is described. A method of upstream/downstream switching based on carrier detection/measurement originated from the master and slave modems embodiment is described, along with upstream/downstream direction switching based on the encoded switching command detection, originating from the master modem.

BRIEF DESCRIPTION OF THE DRAWINGS

The present disclosure will become more fully understood from the detailed description and the accompanying drawings, wherein:

FIG. 1 is a bidirectional TDMA amplifier according to one embodiment.

FIG. 2 is a UWB TDMA cable amplifier switching truth table according to one embodiment.

DETAILED DESCRIPTION

Figure 3:
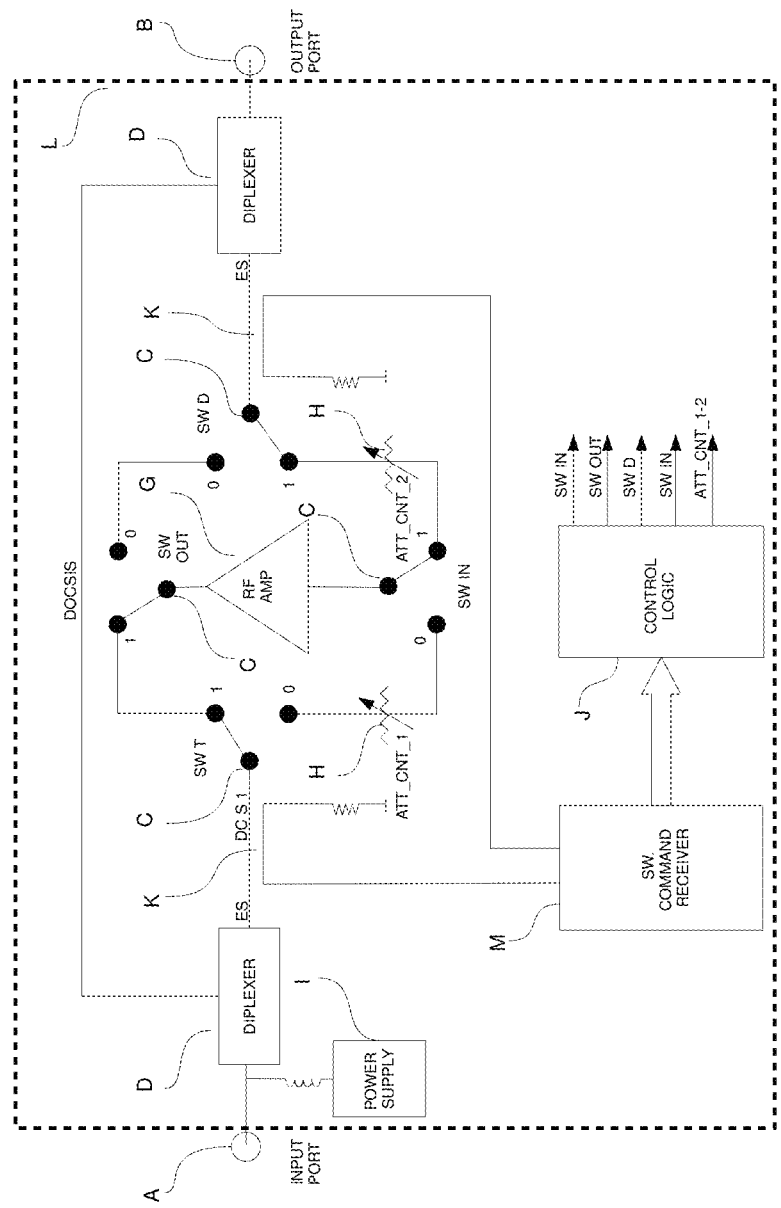
FIG. 3 is a bidirectional TDMA amplifier with SW command receiver according to one embodiment.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present inventions. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require a particular orientation unless explicitly indicated as such.

Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present inventions may be embodied in the form of computer-implemented processes and apparatuses such as processor-based data processing and communication systems or computer systems for practicing those processes. The present inventions may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

This invention relates to the TDMA transmit/receive system that operates in CATV infrastructure, and which is designed to increase data throughput capacity over existing CATV based systems and operating in the ES (Extended Spectrum band). Although, primary embodiment targets drop cable application, there is no obstacle for one skilled in the art to apply described principles in the domain of the distribution cable or similar applications.

Purpose of the extended spectrum TDMA upstream and downstream cable amplifier is to provide signal amplification at the point of drop cable connection and thus providing improved CNR (Carrier to Noise Ratio) to the Slave modem (downstream) on the other side of the drop cable, which results in possibility to operate at higher data throughputs. The data throughput enhancement is bi-directional since amplifier can operate in upstream mode as well, i.e. from the Slave modem to the Master modem on the opposite side of the cable by means of amplification in the direction determined by RF switches state.

The TDMA cable amplifier depicted at the FIG. 1, consists of (A) cable input port, (B) cable output port, (C) RF absorptive SPDT switches, (D) ES/DOCSIS diplexer, (E) logarithmic amplifiers/RF carrier detector, (F) signal level comparator, (G) RF low noise broadband RF amplifier, (H) RF programmable/adjustable attenuator, (I) Amplifier power supply/power conditioning block, (J) control logic block, (K) directional couplers and (L) amplifier circuitry enclosure. Purpose of directional couplers, log amplifiers and comparators circuitry is to detect incoming Master modem or Slave modem signal levels and provide input to control logic that handles RF amplifier input/output switching direction.

These RF switches must provide sufficient isolation in order to prevent a) critical input and output coupling and thus possible amplifier oscillation and b) unamplified signal coupling to the amplified output and signal CNR degradation for which purpose two cascaded RF switches isolation must be sufficiently high. In order to achieve high isolation levels, the RF switches must be of absorptive type, or other appropriate RS switches.

Control logic has to provide amplifier optimal (H) RF attenuators setting, that depends on signal level inputs from Slave and Master modems side measured by log power detectors—signals V(PWR_A) and V(PWR_B) shown on the FIG. 1.

Purpose of the diplexer is to isolate CATV and DOCSIS signals and extended spectrum in which TDMA amplifier operates. Additionally, diplexer must provide sufficient isolation between ES and DOCSIS allocated operating frequencies.

Finally, power supply block must support operation in 60V-90V range and provide sufficient power for the amplifier operation. Implementation assumes feed from the Tap Box port through high frequency isolating choke.

It is noted that, in an alternative embodiment, the RF amplifier of FIG. 1 may comprise two separate amplifiers, one amplifier for downstream communications and one amplifier for upstream communications.

The TDMA cable amplifier switch truth table as well as switch/amplification direction are shown in the table at FIG. 2.

The FIG. 3 shows the TDMA receiver that instead of signal comparators contains (M) Switch command receiver that sets-on direction of TDMA receiver upstream or downstream amplification, based on the encoded command from the Master modem. The command could be send by means of separate RF channel or variety of other means. In this embodiment the switch receiver also contains means of measuring RF signal input levels coming from master and slave modems by internally implemented RF power detectors. The RF signal in both cases is picked-up from (K) Directional couplers connected in series with ports A and B.

FIGURES KEY

FIG. 1: Bidirectional TDMA Amplifier
A—Cable input port; B—Cable output port; C—RF absorptive SPDT switch; D—ES/DOCSIS diplexer; E—Logarithmic amplifiers/RF carrier detector; F—Signal Level Comparator; G—RF low noise broadband amplifier; H—RF programmable/adjustable attenuator; I—Amplifier power supply/power conditioning block; J—Control logic block; K—Directional coupler; L—Amplifier circuitry enclosure FIG. 2: UWB TDMA Cable Amplifier Switching Truth Table FIG. 3: Bidirectional TDMA Amplifier with SW Command Receiver
A—Cable input port; B—Cable output port; C—RF absorptive SPDT switch; D—ES/DOCSIS diplexer; G—RF low noise broadband amplifier; H—RF programmable/adjustable attenuator; I—Amplifier power supply/power conditioning block; J—Control logic block; K—Directional coupler; L—Amplifier circuitry enclosure; M—Switch Command Receiver Broadly understood, the inventions disclosed herein may include:

The method of proprietary TDMA data modulated signals switching via bidirectional amplification over CATV infrastructure.

The method of Upstream/Downstream switching based on the carrier detection/measurement originated from master and slave modems.

The Method of Upstream/Downstream switching based on the encoded switching command detection originated from master modem.

While the inventions have been described with respect to specific examples including presently preferred modes of carrying out the inventions, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:

1. An amplification system comprising:
an input port;
an output port;
at least one amplifier;
one or more amplifier ports operably coupled to the input and output ports;
at least one diplexer operably coupled to the input and output ports; and
a controller configured to:
   manage communications through the amplification system by turning on and off switches in upstream and downstream communication paths based, at least in part, on:
      a comparison between a first detected power and a first reference power; and
      a comparison between a second detected power and a second reference power,
   the at least one diplexer configured to at least isolate an extended spectrum (ES) band from one or more operating frequencies allocated to one or more DOCSIS signals.

2. The amplification system of claim 1:
wherein the controller is further configured to:
   receive at least one edge signal from at least one of: a rising edge detector or a falling edge detector; and
   manage the communications further based, at least in part, on the at least one edge signal.

3. The amplification system of claim 1 wherein the at least one amplifier comprises a first amplifier for downstream communications and a second amplifier for upstream communications.

4. The amplification system of claim 1, wherein the at least one diplexer is further configured to at least isolate one or more DOCSIS signals from one or more Cable TV (CATV) signals.

5. A method performed by an amplification system, the amplifier comprising:
an input port;
an output port;
at least one amplifier;
at least one diplexer;
one or more amplifier ports operably coupled to the input and output ports;
at least one diplexer operatively coupled to the input and output ports; and
a controller, the method comprising:
   comparing a first detected power with a first reference power;
   comparing a second detected power with a second reference power; and
   managing communications through the amplification system based, at least in part, on the comparing, the managing comprising:
      turning on and off switches in upstream and downstream communication paths; and the method further comprising:
      isolating, via the at least one diplexer, an extended spectrum (ES) band from one or more operating frequencies allocated to one or more Data Over Cable Service Interface Specification (DOCSIS) signals.

6. The method of claim 5, further comprising:
receiving at least one edge signal from at least one of: a rising edge detector or a falling edge detector; and
managing the communications further based, at least in part, on the at least one edge signal.

7. The method of claim 5, wherein the at least one amplifier comprises a first amplifier for downstream communications and a second amplifier for upstream communications.

8. The method of claim 5, further comprising isolating, via the at least one diplexer, one or more DOCSIS signals from one or more Cable TV (CATV) signals.

* * * * *